United States Patent [19]

Seki

[11] Patent Number: 5,025,293
[45] Date of Patent: Jun. 18, 1991

[54] CONDUCTIVITY MODULATION TYPE MOSFET

[75] Inventor: Yasukazu Seki, Kanagawa, Japan

[73] Assignee: Fuji Electric Co., Ltd., Kawasaki, Japan

[21] Appl. No.: 467,848

[22] Filed: Jan. 22, 1990

[30] Foreign Application Priority Data

Jan. 25, 1989 [JP] Japan .................. 1-15901

[51] Int. Cl.[5] ............................................. H01L 29/78
[52] U.S. Cl. .................................. 357/23.4; 357/38; 357/39; 357/63
[58] Field of Search ................. 357/23.4, 38, 39, 63

[56] References Cited

U.S. PATENT DOCUMENTS

| | | | |
|---|---|---|---|
| 4,639,761 | 1/1987 | Singer et al. | 357/23.4 |
| 4,782,379 | 11/1988 | Baliga | 357/23.4 |
| 4,855,799 | 8/1989 | Tanabe et al. | 357/23.4 |
| 4,881,107 | 11/1989 | Matsushita | 357/23.4 |
| 4,881,112 | 11/1989 | Matsushita | 357/23.4 |
| 4,893,165 | 1/1990 | Miller et al. | 357/23.4 |
| 4,967,255 | 10/1990 | Bauer et al. | 357/23.4 |
| 4,972,239 | 11/1990 | Mihara | 357/23.4 |
| 4,985,741 | 1/1991 | Bauer et al. | 357/38 |

FOREIGN PATENT DOCUMENTS

| | | | |
|---|---|---|---|
| 61-216363 | 9/1986 | Japan | 357/23.4 |
| 62-76556 | 4/1987 | Japan | 357/38 |
| 62-235782 | 10/1987 | Japan | 357/38 |
| 63-18675 | 1/1988 | Japan | 357/23.4 |
| 63-205957 | 8/1988 | Japan | 357/38 |
| 63-205958 | 8/1988 | Japan | 357/38 |

Primary Examiner—Michael C. Wimer
Assistant Examiner—Steven Loke
Attorney, Agent, or Firm—Brumbaugh, Graves, Donohue & Raymond

[57] ABSTRACT

A conductivity modulation MOSFET having a second buffer layer is disclosed. The second buffer layer is thinner and has a higher impurity concentration than the first buffer layer. The second buffer layer is interspersed with heavy metal atoms such as gold and platinum that facilitate recombination of holes and electrons thereby shortening turn off time. However, because of the relative thinness of the second layer compared to the first layer, the second layer has almost no influence in increasing ON resistance.

8 Claims, 2 Drawing Sheets

CONDUCTIVITY MODULATION TYPE MOSFET

BACKGROUND OF THE INVENTION

The present invention relates to a conductivity modulation type MOSFET (hereafter referred to as IGBT) and more particularly an IGBT with a structure in which the turn-off time is shortened.

Conventionally, the basic structure of an IGBT, as shown in FIG. 3, is a vertical structure with a P+ type substrate as a drain layer (collector layer) 1, an N+ type buffer layer 2, an N− type conductivity modulation layer (base layer) 3, a P-type base region 4 in an island shape, an N+ type source region (emitter region) 5 in an island shape, a gate oxide film 6, a polysilicon gate 7 and a source electrode (emitter electrode) 8.

When a positive gate voltage is applied, an n-channel is formed, and electrons flow into the conductivity modulation layer 3 of an N− type base from the N+ type source region. This electron flow, lowers the voltage of the conductivity modulation layer 3, thereby forward biasing a P+N− junction on the drain side. As a result, positive holes flow into the N− type conductivity modulation layer 3 from the P+ type drain layer 1, and the resistance of the conductivity modulation layer 3 is lowered significantly. Thus, the on-resistance of the IGBT decreases.

During the turn-off period in which the gate voltage has been removed, the P-type base region 4 and the N− type conductivity modulation layer 3 are reverse biased, and the electrons are swept out to the side of the drain layer 1, while the positive holes are swept out to the side of the source region 5 by the enlargement of a depletion region. Thereafter, excess charges of electrons and positive holes that have accumulated and remain in the non-depletion region on the conductivity modulation layer 3 are reduced by means of recombination, thus reaching a thermal equilibrium state.

There are two known methods for shortening the turn-off time, in order to permit remaining electrons and positive holes to recombine quickly at the recombination center. One method produces crystal defects inside a semiconductor intentionally by irradiating the recombination center. The second method applies the doping of heavy metal atoms such as gold and platinum, using the resulting impurity center as the recombination center. For both techniques, a localized level is formed in the forbidden band and is used as a field for recombination, functioning as a life time killer.

In an IGBT with a vertical structure, however, the above-mentioned introduction method of the life time killer is applied uniformly to each layer in the vertical direction. Therefore, although the turn-off time is shortened, reduction of on-resistance which is a feature of the IGBT is diminished compared with the above. That is, although the irradiation produces a plurality of crystal defects on the two sides of the semiconductor substrate, it is difficult to introduce them locally into the vicinity of the non-depletion region in the conductivity modulation layer 3 even if the acceleration energy or the doping quantity is varied. Furthermore, although it is possible to control the diffusion depth by the diffusion temperature and the diffusion time, it is still difficult and impractical to introduce the crystal defects locally into the vicinity of the non-depletion region on a controlled basis.

Accordingly, it is an object of the present invention to provide a conductivity modulation type MOSFET in which a second buffer layer, which is to become a gettering region in the substrate structure, is formed in advance without positively introducing the life time killer. This way the gettering of heavy metal atoms progresses naturally. Thereafter, the second buffer layer will function as a local life time killer region as the result thereof, thus making it possible to realize a shortening of the turn-off time while maintaining a low on-resistance.

SUMMARY OF THE INVENTION

In order to provide a conductivity modulation MOSFET having a shortened turn off time while maintaining a low ON resistance, in accordance with the present invention, a second buffer layer is formed in a conventional MOSFET. The MOSFET structure includes a semiconductor substrate of a first conductive type, a first buffer layer of a second conductive type formed on the substrate, and a modulation layer of a second conductive type. The second buffer layer, of the second conductive type, is disposed between the first buffer layer and the conductivity modulation layer. The second buffer layer is thinner and has a higher impurity concentration than the first buffer layer. The second buffer layer is interspersed primarily within a predetermined localized area with a plurality of heavy metal atoms, such as gold or platinum. By introducing the heavy metals through the back of the substrate, upon subsequent heating the heavy metal atoms concentrate in the second buffer layer. The higher concentration of heavy metal atoms within the second buffer layer is effective in shortening the turn off time while maintaining the low ON resistance. Gold and Platinum are examples of heavy metal atoms that can be interspersed in the second buffer layer. The MOSFET can be configured, among other ways, as in insulated gate bipolar MOSFET.

Further in accordance with the invention, a method of manufacturing a low On resistance, shortened off time, modulation conductivity MOSFET includes the following steps.

First, a semiconductor substrate is formed. A first buffer layer is then formed on the substrate. Next, a higher concentrated buffer layer is formed on the first buffer layer and a conductivity layer is formed on the higher concentrated buffer layer. A base region is diffused in the conductivity layer. Heavy metal atoms are applied into the back of the substrate. During subsequent heating, the heavy metal atoms concentrate at the higher concentrated buffer layer. In this method the steps diffusing the base region and applying the heavy metal atoms may be conducted simultaneously.

In operation of the invention as described above, the second buffer region seizes more heavy metal atoms as compared with other layers by means of a positive introduction of heavy metal atoms or natural contamination, etc. during the process and functions as the life time killer region. The second buffer region with a higher impurity concentration, as compared with the impurity concentration of the first buffer region, becomes a potential barrier against electrons and positive holes during the turn-on period and the steady-on period. However, because the thickness of the second buffer layer is less than that of the first buffer layer, the second buffer region has almost no influence on the increase of the ON-resistance. During the turn-off period, the injection of minority carriers from the semiconductor substrate side of the first conductive type into the conductivity modulation layer is suppressed by the first buffer layer. On the other hand, electrons and positive holes that have been swept out to the non-depletion region of the conductivity modulation layer are seized quickly by the heavy metal atoms in the adjacent second buffer region functioning as the time killer region and become extinct by means of recombination. Accordingly, the turn-off time is shortened.

For better understanding of the invention, as well as other objects and further features thereof, reference is made to the following detailed description of a preferred embodiment taken in conjunction with the accompanying drawings.

DESCRIPTION OF THE PREFERRED EMBODIMENTS

Figure 1:
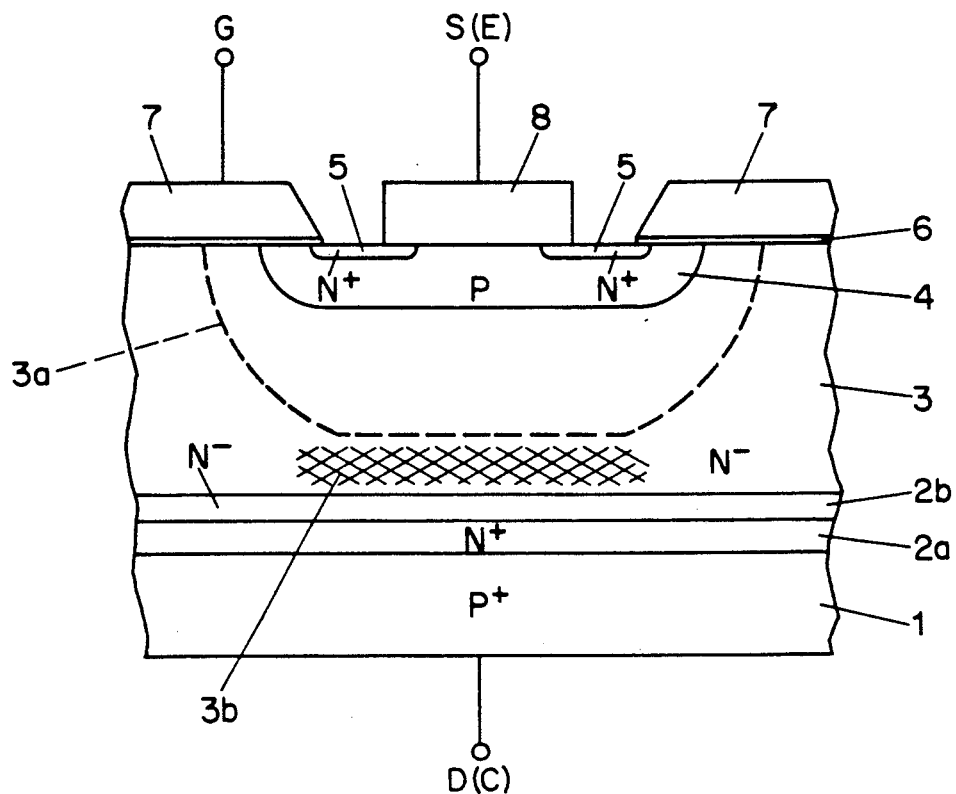
FIG. 1 is a sectional view showing the basic structure of an embodiment of a conductivity modulation type MOSFET according to the present invention.
Figure 3:
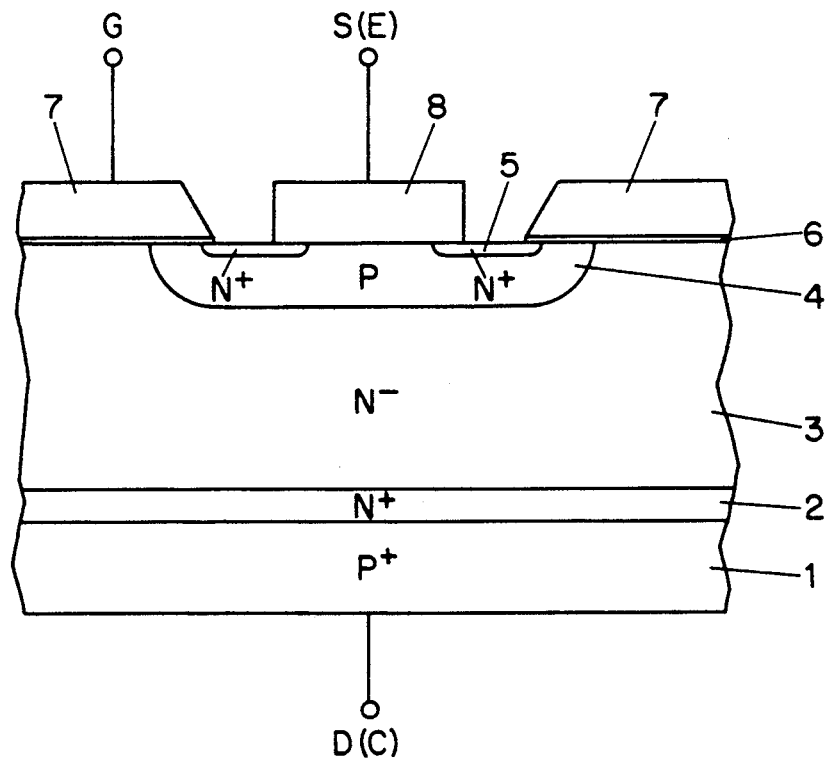
FIG. 3 is a sectional view showing the basic structure of a conventional conductivity modulation type MOSFET.

FIG. 1 is a sectional view showing the basic structure of an embodiment of a conductivity modulation type MOSFET according to the present invention. A drain layer 1 (a collector layer) of a P+ type semiconductor substrate with a high impurity concentration functions as a layer injected with minority carriers. An N+ type first buffer layer 2a with a high impurity concentration is formed on this P+ type semiconductor substrate 1. The first buffer layer 2a controls the injection of positive holes during the turn-off time. On this first buffer layer 2a, an N++ type second buffer layer 2b of higher concentration than the impurity concentration thereof is formed. The thickness of N++ type second buffer layer is several μms, and is thinner than the first buffer layer 2a. A conductivity modulation layer 3 (N− base layer) of an N− epitaxial layer is formed on the second buffer layer 2b. A P-type base region 4 (P-body) is formed in an island shape on the top of the conductivity modulation layer 3, on which an N+ type source region (an emitter region) 5 with a high impurity concentration is further formed in a vertical island shape. Other elements include an oxide film 6, a polysilicon gate 7 as a gate electrode, and a source electrode 8 (an emitter electrode) which bridges both N+ type source regions 5.

Since impurities in the second buffer layer 2b are highly concentrated, contaminated heavy metal atoms are applied with gettering spontaneously during the impurity diffusion process in the P-type base region 4, etc. However, in the present embodiment, heavy metal atoms of gold or platinum are introduced intentionally from the back into the basic structure in which the conductivity modulation layer 3 is formed. These excess heavy metal atoms are mostly seized in the second buffer layer 2b during the heat treatment in the process thereafter, thus the concentration of heavy metal atoms in the second buffer layer 2 becomes higher compared to other layers and the second buffer layer 2 functions principally as a life time killer or a recombination center layer.

Figure 2A:
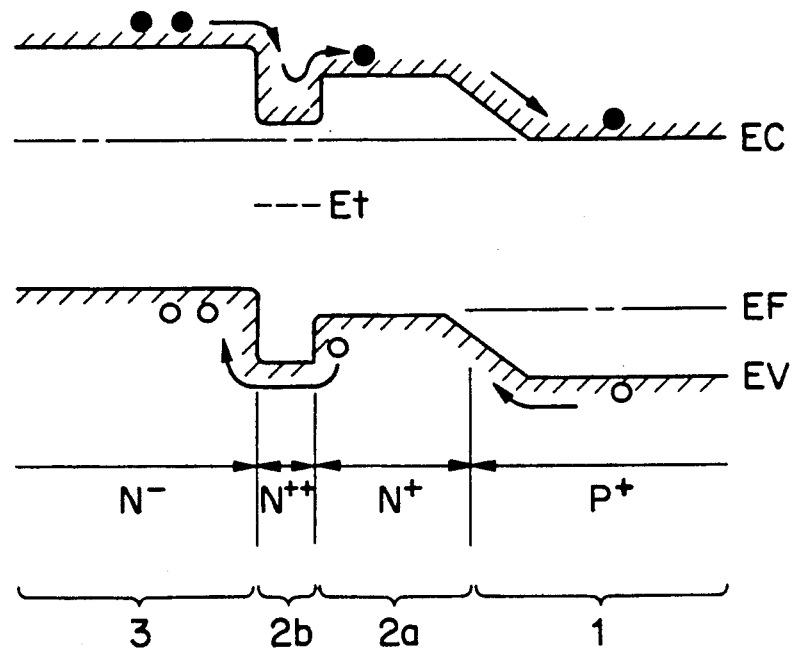
FIG. 2A is an energy band diagram in the turn-on period of the embodiment.
Figure 2B:
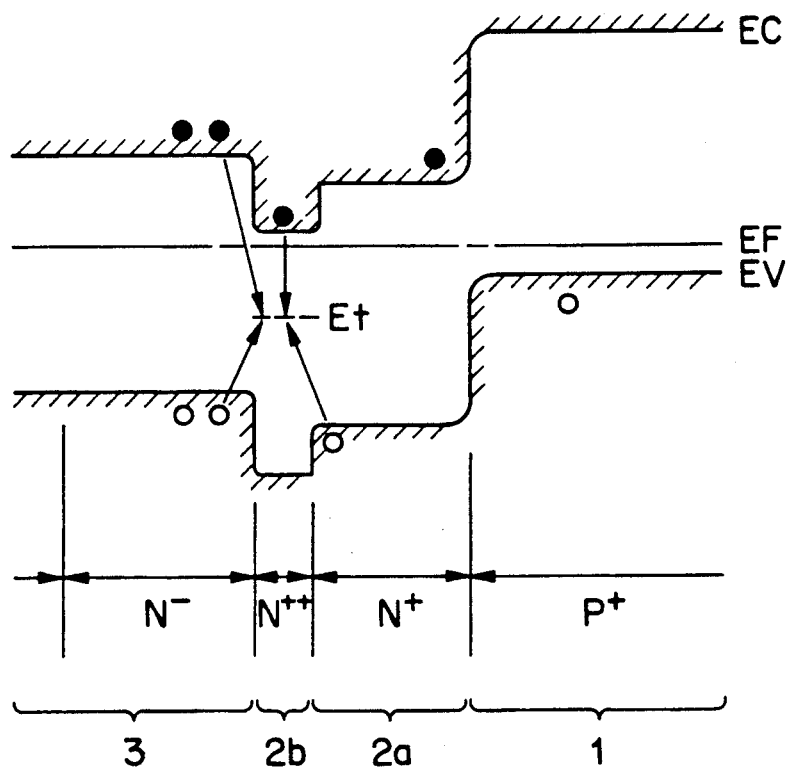
FIG. 2B is an energy band diagram in the turn-off period of the embodiment.

When a positive gate voltage is applied to a polysilicon gate 7, an n-channel is formed in a MOS portion, and the electrons of a majority carrier flow into the N− type conductivity modulation layer 3 from the N+ type source region 5 through the n-channel. As a result, the density of electrons that are majority carriers in the N− type conductivity modulation layer 3 is increased, thus lowering its potential. Therefore, as FIG. 2A shows, the P+N− junction on the side of the drain layer 1 is applied with a forward bias. As a result, positive holes that are minority carriers are injected into the conductivity modulation layer 3 from the drain layer 1, and concentrations of electrons and positive holes are rapidly increased in the conductivity modulation layer 3, thus inducing a conductivity modulation state. This is the turn-on period or the steady-on state, but the second buffer 2b acts as a potential barrier against the electrons and positive holes as shown in FIG. 2. In other words, the potential difference between the second buffer layer 2b and the first buffer layer 2a acts as a potential barrier for both carriers. However, since the thickness of the second buffer layer 2b is less than that of the first buffer layer, with the help of kinetic energy electrons move to the buffer layer 2a easily, and positive holes move to the conductivity modulation layer 3 without hindrance. Furthermore, since the impurity concentration of the conductivity modulation layer 3 is lower than that of the second buffer layer 2b in the present embodiment, both movements are liable to occur. Accordingly, the ON-resistance in the conductivity modulation type MOSFET of the present embodiment has a low value equivalent to that of a conventional product without the second buffer layer 2b.

Next, during the turn-off period, the Fermi energy $E_f$ of each type P+, N+, N++ and N− is such that when the gate voltage becomes zero, a high potential barrier is generated between the first buffer layer 2a and the drain layer 1. As a result, the injection of positive holes from the drain layer 1 into the first buffer layer 2a is prevented. Furthermore, the second buffer layer 2b also aids in preventing the injection of positive holes. Finally, electrons are also checked from flowing into the conductivity modulation layer 3 because of the extension of the n-channel. At the same time, FIG. 1 shows that a depletion end or boundary 3a is expanded in the conductivity modulation layer 3, electrons and positive holes are swept out to a non-depletion region 3b shown with a hatched portion, and the drain current is rapidly reduced. Excess charges of electrons and positive holes remaining in the second buffer layer 2b and the first buffer layer 2a as well as in the non-depletion region 3b are reduced to a certain degree by direct recombination, but recombination acts predominantly through a localized level Et level in a forbidden band formed by heavy metal atoms of a higher concentration than usual in the second buffer layer 3b. As a result, the life of the carriers is shortened significantly, and the turn-off time is shortened considerably compared to the conventional case.

Because the conductivity modulation layer 3 in above-mentioned embodiment is of an N-type, if it is assumed that the localized level Et, which is a deep impurity level, is an acceptor type, the electrons pulled into the potential hole of the second buffer layer 2b are seized easily at the recombination center of the localized level Et, thus contributing further to a shortening of the turn-off time.

As explained above, the conductivity modulation type MOSFET according to the present invention is constructed with a substrate provided, between the first buffer layer and the conductivity modulation layer, with the second buffer region having a higher impurity concentration and decreased thickness compared with the first buffer layer and with the same conductive type as the first buffer layer. Thus, the following effects are obtained.

That is, the second buffer region under the conductivity modulation layer functions as a local life time killer region by means of the positive introduction of heavy metal atoms or natural contamination during the process. Therefore, the on-resistance may be maintained at a level equivalent to the conventional case during the turn-on period and the steady-on period.

At the same time, electrons and positive holes in the non-depletion region in the conductivity modulation layer are made to recombine principally during the turn-off period. Therefore, the turn-off period is shortened compared with the conventional case.

While there has been described what is believed to be a preferred embodiment of the invention, those skilled in the art will recognize that modification may be made thereto without departing from the spirit of the invention and it is intended to claim all such modifications as fall within the scope of the invention.

I claim:

1. In a conductivity modulation MOSFET having a semiconductor substrate of a first conductive type, a first buffer layer of a second conductive type formed on said substrate, a conductivity modulation layer of a second conductive type, and characterized by a low on resistance and a turn off time, the improvement comprising:

a second buffer layer of the second conductive type disposed between said first buffer layer and said conductivity modulation layer, thinner than and having a higher impurity concentration than said first buffer layer, and interspersed with a plurality of heavy metal atoms;

whereby the concentration of heavy metal atoms within said second buffer layer is effective in shortening said turn off time while maintaining a low on resistance.

2. A conductivity modulation MOSFET according to claim 1, wherein said MOSFET is configured as an insulated gate bipolar metal oxide silicon field effect transistor.

3. A conductivity MOSFET according to claim 1, wherein said heavy atoms comprise gold.

4. A conductivity MOSFET according to claim 1, wherein said heavy atoms comprise platinum.

5. In a conductivity modulation MOSFET having a semiconductor substrate of a first conductive type, a first buffer layer of a second conductive type formed on said substrate, a conductivity modulation layer of a second conductive type, a base region of a first conductive type within a surface region of said conductivity modulation layer, a source region of a second conductive type within a surface region of said base region, a source electrode coupled to said base and source regions and an insulated gate electrode, and characterized by a low on resistance and a turn off time, the improvement comprising:

a second buffer layer of the second conductive type disposed between said first buffer layer and said conductivity modulation layer, thinner than and having a higher impurity concentration than said first buffer layer, and interspersed with a plurality of heavy metal atoms primarily within a predetermined localized area below said base region:

whereby the concentration of heavy metal atoms within said second buffer layer is effective in shortening said turn off time while maintaining a low on resistance.

6. A conductivity modulation MOSFET according to claim 5, wherein said MOSFET is configured as an insulated gate bipolar metal oxide silicon field effect transistor.

7. A conductivity modulation MOSFET according to claim 5, wherein said heavy atoms comprise gold.

8. A conductivity modulation MOSFET according to claim 5, wherein said heavy atoms comprise platinum.

* * * * *

UNITED STATES PATENT AND TRADEMARK OFFICE
CERTIFICATE OF CORRECTION

PATENT NO. : 5,025,293

DATED : June 18, 1991

INVENTOR(S) : Yasukazu Seki

It is certified that error appears in the above-identified patent and that said Letters Patent is hereby corrected as shown below:

Column 6, line 9, "conductivity MOSFET" should read --conductivity modulation MOSFET--;

Column 6, line 11, "conductivity MOSFET" should read --conductivity modulation MOSFET--.

Signed and Sealed this

Third Day of November, 1992

Attest:

DOUGLAS B. COMER

Attesting Officer

Acting Commissioner of Patents and Trademarks